United States Patent
Sasaki

(10) Patent No.: US 8,575,629 B2
(45) Date of Patent: Nov. 5, 2013

(54) LIGHT-EMITTING ELEMENT, LIGHT-EMITTING DEVICE USING THE LIGHT-EMITTING ELEMENT, AND TRANSPARENT SUBSTRATE USED IN LIGHT-EMITTING ELEMENTS

(75) Inventor: Hiroshi Sasaki, Mito (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/133,163

(22) PCT Filed: Nov. 12, 2009

(86) PCT No.: PCT/JP2009/069275
§ 371 (c)(1),
(2), (4) Date: Jun. 7, 2011

(87) PCT Pub. No.: WO2010/067687
PCT Pub. Date: Jun. 17, 2010

(65) Prior Publication Data
US 2011/0235327 A1    Sep. 29, 2011

(30) Foreign Application Priority Data

Dec. 12, 2008 (JP) ................................. 2008-316343

(51) Int. Cl.
*H01L 51/52*    (2006.01)
(52) U.S. Cl.
USPC ................... 257/88; 257/13; 257/79; 257/98; 257/100
(58) Field of Classification Search
USPC .......................................................... 257/88
See application file for complete search history.

(56) References Cited

U.S. PATENT DOCUMENTS

| | | | |
|---|---|---|---|
| 7,700,958 B2* | 4/2010 | Nishi et al. ...................... 257/88 |
| 7,812,516 B2* | 10/2010 | Maruyama et al. ........... 313/503 |
| 7,952,105 B2* | 5/2011 | Cok ................................ 257/79 |
| 8,153,157 B2* | 4/2012 | Obae et al. .................... 424/489 |

(Continued)

FOREIGN PATENT DOCUMENTS

| | | |
|---|---|---|
| EP | 2141962 | 1/2010 |
| JP | 2004-240114 | 8/2004 |

(Continued)

OTHER PUBLICATIONS

The 55th Meeting of The Japan Society of Applied Physics and Related Societies, Mar. 30, 2008, 30a-ZA-1. (Partial English language translation).

(Continued)

*Primary Examiner* — Chuong A Luu
*Assistant Examiner* — Jaehwan Oh
(74) *Attorney, Agent, or Firm* — Antonelli, Terry, Stout & Kraus, LLP.

(57) ABSTRACT

In order to improve the light extraction efficiency of a light-emitting element, the light-emitting element includes: a light-emitting layer provided between an electrode and a transparent substrate; a particle layer provided between the light-emitting layer and the transparent substrate; and an adhesive layer provided between the light-emitting layer and the particle layer, the particle layer includes particles having a refraction index that is higher than a refraction index of the transparent substrate, the adhesive layer has a refraction index that is higher than the refraction index of the transparent substrate, and the particle layer has an average thickness that is less than an average particle size of the particles.

18 Claims, 7 Drawing Sheets

(56) References Cited

U.S. PATENT DOCUMENTS

| | | | |
|---|---|---|---|
| 2002/0021479 A1* | 2/2002 | Scalora et al. | 359/241 |
| 2004/0156912 A1* | 8/2004 | Kawamura et al. | 424/489 |
| 2004/0217702 A1 | 11/2004 | Garner et al. | |
| 2006/0049745 A1* | 3/2006 | Handa et al. | 313/503 |
| 2007/0267966 A1 | 11/2007 | Numajiri et al. | |
| 2009/0051278 A1* | 2/2009 | Saneto et al. | 313/504 |
| 2010/0252111 A1* | 10/2010 | Kikuchi et al. | 136/261 |
| 2011/0235327 A1* | 9/2011 | Sasaki | 362/249.01 |

FOREIGN PATENT DOCUMENTS

| | | |
|---|---|---|
| JP | 2004-296437 | 10/2004 |
| JP | 2006-100137 | 4/2006 |
| JP | 2006-294491 | 10/2006 |
| JP | 2007-227073 | 9/2007 |
| JP | 2007-273397 | 10/2007 |
| JP | 2008-243669 | 10/2008 |
| JP | 2008-269962 | 11/2008 |
| JP | 2009-070814 | 4/2009 |
| WO | WO2008/123492 | 10/2008 |

OTHER PUBLICATIONS

The 55th Meeting of The Japan Society of Applied Physics and Related Societies, Mar. 30, 2008, 30a-ZA-1.

Extended European Search Report in EP 09831793.6-1235 (10 pgs.), mailed Feb. 6, 2013.

* cited by examiner

LIGHT-EMITTING ELEMENT, LIGHT-EMITTING DEVICE USING THE LIGHT-EMITTING ELEMENT, AND TRANSPARENT SUBSTRATE USED IN LIGHT-EMITTING ELEMENTS

TECHNICAL FIELD

The present invention relates to a light-emitting element, a light-emitting device using the light-emitting element, and a transparent substrate used in the light-emitting element.

BACKGROUND ART

Many manufacturers are competing to develop an electroluminescence element (OLED element) made of an organic material for an application such as a thin and space-saving illumination or a display.

The greatest challenge is to improve the external light extraction efficiency of the element. This is because more than half of the light emitted from inside the element cannot be output to the outside of the element due to the effect that the emitted light is reflected by a transparent electrode or the like having a high refraction index in the middle of exiting the element or other such effects. To address this problem, there have been proposed several approaches of providing various layers (light extraction efficiency improving layers) for improving the light extraction efficiency to the transparent electrode or the like.

Patent Literatures 1 and 2 propose improving the light extraction efficiency by providing on the transparent electrode a layer in which particles are dispersed in a binder, the particles having a refraction index that is different from that of the binder. Further, Non Patent Literature 1 proposes improving the light extraction efficiency by providing a layer formed of a titanium oxide thin film having voids therein.

In Patent Literatures 1 and 2, the binder layer containing the particles involves an organic solvent and is thus formed by, instead of a vacuum process, preparing a mixture of the binder, the powders, and the organic solvent, and applying and drying the mixture under normal pressure. In Non Patent Literature 1, the layer is also formed on the transparent electrode under normal pressure by spin coating. In Patent Literatures 1 and 2, and Non Patent Literature described above, the light extraction efficiency improving layer is provided on the transparent electrode.

PRIOR ART DOCUMENT

Patent Document

[Patent Document 1] JP 2004-296437 A
[Patent Document 2] JP 2007-273397 A

Non-Patent Document

[Non-Patent Document 1] The 55th Meeting of The Japan Society of Applied Physics and Related Societies 30a-ZA-1 (2008.3.30)

DISCLOSURE OF THE INVENTION

Problems to be Solved by the Invention

Incidentally, there is a light-emitting layer made of an organic material inside a transparent electrode of an OLED element, which degrades in light-emitting property when touched by an organic solvent due to swelling, dissolution, or the like. Further, the light-emitting layer made of the organic material undergoes heat denaturation when heated, with the result that the light-emitting property is reduced to emit no light in some cases.

In addition, the transparent electrode is formed by spattering or the like, which may form nanoscale gaps at the surface of the layer. Therefore, when liquid containing an organic solvent is applied on the transparent electrode, the organic solvent may infiltrate from the nanoscale gaps to contact the light-emitting layer. Further, drying the solvent and curing the binder involve a heating process, which may cause a thermal damage to the light-emitting layer. Accordingly, when the light extraction efficiency improving layer containing particles is provided on the transparent electrode, the light-emitting layer may be damaged to reduce the light extraction and utilization efficiency.

It is an object of the present invention to improve the light extraction and utilization efficiency of the light-emitting layer.

Means for Solving the Problems

In order to solve the above-mentioned problem, a light-emitting element according to the present invention includes: a light-emitting layer provided between an electrode and a transparent substrate; a particle layer provided between the light-emitting layer and the transparent substrate; and an adhesive layer provided between the light-emitting layer and the particle layer, in which the particle layer has a refraction index that is higher than a refraction index of the transparent substrate.

Effect of the Invention

According to the present invention, the light extraction efficiency of the light-emitting element may be improved.

BEST MODE FOR CARRYING OUT THE INVENTION

Referring to the accompanying drawings, embodiments of the present invention are described.

Figure 1:
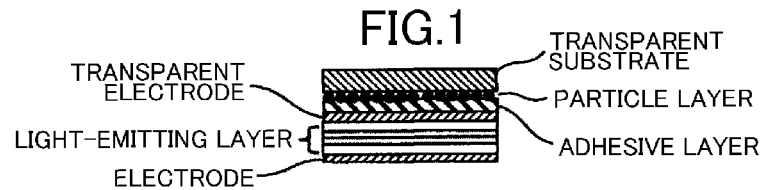
FIG. 1A sectional structure of a light-emitting element according to the present invention.

FIG. 1 is a schematic sectional view illustrating a light-emitting element according to the present invention. A light-emitting layer is provided between a transparent electrode and an electrode. An adhesive layer, a particle layer, and a transparent substrate are provided on the side of the transparent electrode opposite to the side on which the electrode is provided. Aluminum or other such materials having high reflectivity are used for the electrode, and hence most of light emitted from the light-emitting layer travels to the transparent electrode side. With the above-mentioned configuration, light leaks from a contact portion between particles having a high refraction index and an adhesive layer and is scattered by the particles, with the result that the effect of extracting light is presumably improved.

Figure 2:
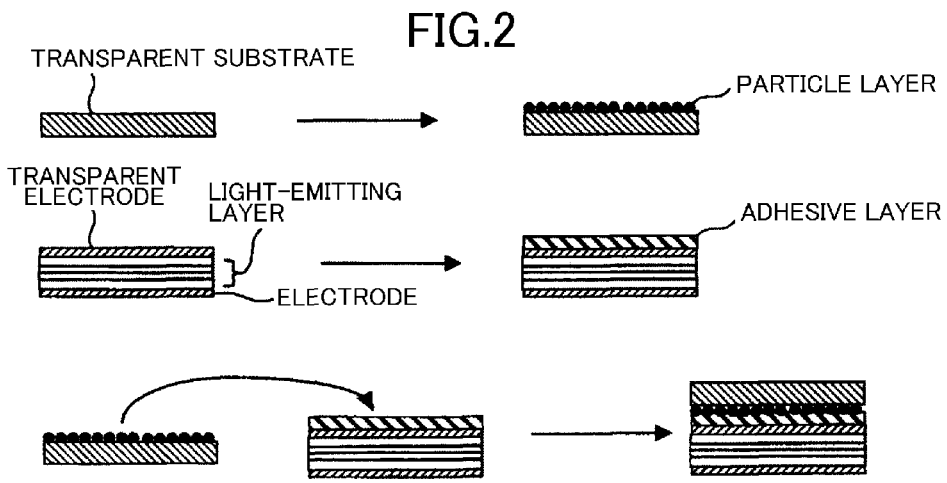
FIG. 2 A production process of the light-emitting element according to the present invention.

FIG. 2 illustrates a process of forming the light-emitting element of FIG. 1. The particle layer is formed on the transparent substrate. The resultant is referred to as an intermediate part 1. A structure is formed of the transparent electrode, the light-emitting layer, and the electrode, and the adhesive layer is formed on the transparent electrode side. The resultant is referred to as an intermediate part 2. The particle layer side of the intermediate part 1 is bonded to the adhesive layer of the intermediate part 2 to form the light-emitting element. The adhesive layer may be attached to the particle layer side of the intermediate part 1 instead of the intermediate part 2. Glass is more preferred as the material of the transparent substrate than a resin in terms of the solvent resistance and the hardness. In the case of the resin, there is a disadvantage that an acrylic board having a relatively high hardness exhibits high moisture absorption. To address this problem, the acrylic board is coated with a resin having low moisture absorption, for example, a cycloolefin-based resin to suppress moisture absorption, to thereby enable the use for the transparent substrate.

A method of forming the particle layer in a case where a binder is used is described. First, in order to increase the dispersibility in the solvent and to suppress agglomeration of the particles after the application, surfaces of the particles are chemically modified with a silane coupling agent. The particles of the particle layer are dispersed in an organic solvent together with a small amount of a binder material. In this manner, a coating for forming the particle layer is prepared. The coating is applied on the transparent substrate and the binder material is cured to form the particle layer.

In order to bind the silane coupling agent to the surfaces of the particles of the particle layer, the silane coupling agent is first added to the organic solvent, to which the particles of the particle layer are added and stirred for several hours. After the solvent is volatilized by an evaporator, the particles of the particle layer are heated at 120° C. for 30 minutes. In this manner, the silane coupling agent is bound to the surfaces of the particles of the particle layer by silicon-oxygen coupling. When the additive amount of the silane coupling agent used is too large, there is a higher chance for the particles of the particle layer to agglomerate after being applied to the substrate. Therefore, the surface area of the particles of the particle layer is measured in advance by the BET theory or the like and the requisite minimum amount of the silane coupling agent for coating the area is used, to thereby prevent the agglomeration of the particles.

It is preferred that the binder material be a material that forms a binder of an inorganic oxide such as silica sol or titania sol, which has high affinity with the inorganic particles. Further, in a case where an organic resin is used, it is preferred to use an epoxy resin which has high adherence with the inorganic particles. Other preferred organic materials are an acrylic resin, a polycarbonate resin, and the like, which are highly transparent.

The silane coupling agent as used herein refers to a silane coupling agent in which two or three alkoxysilane groups are bonded to a silicon atom, or a silane coupling agent in which two or three chloro groups are bonded to a silicon atom. As the substituent for silicon other than an alkoxysilane group and a chloro group, Structure group 1 and Structure group 2 described below are suitable for the dispersion of particles in the particle layer.

(Structure Group 1)

—$(CH_2)_3NHCOCH_3$, —$(CH_2)_3NHCOCH_2CH_3$, —$(CH_2)_3NHCOC_3H_7$, —$(CH_2)_3NHCOC_4H_9$, —$(CH_2)_3NHCOC_5H_{11}$, —$(CH_2)_3NHCOC_6H_{13}$, —$(CH_2)_3NHCOC_7H_{15}$, —$(CH_2)_3NHCOC_8H_{17}$

Structure group 1 is produced by: preliminarily allowing a silane coupling agent having a —$(CH_2)_3NH_2$ group to bind to the surfaces of the particles of the particle layer; and then allowing the corresponding carboxylic acid to react with the amino group.

(Structure Group 2)

—$(CH_2)_3NHCO_2CH_3$, —$(CH_2)_3NHCO_2CH_2CH_3$, —$(CH_2)_3NHCO_2C_3H_7$, —$(CH_2)_3NHCO_2C_7H_9$, —$(CH_2)_3NHCO_2C_5H_{11}$, —$(CH_2)_3NHCO_2C_6H_{13}$, —$(CH_2)_3NHCO_2C_7H_{15}$, —$(CH_2)_3NHCO_2C_8H_{17}$

Structure group 2 is produced by: preliminarily allowing a silane coupling agent having a —$(CH_2)_3NCO$ group to bind to the surfaces of the particles of the particle layer; and then allowing the corresponding alcohol to react with the isocyanate group.

In addition to the silane coupling agents described above, a silane coupling agent having an isocyanate group, a vinyl group, a 3-glycidoxypropyl group, or a 3-chloropropyl group is suitable for the dispersion of particles in the particle layer.

Hydrocarbon substituents such as —$C_6H_{13}$, —$C_8H_{17}$, and —$C_{10}H_{21}$, or aromatic substituents, such as —$C_6H_5$ and —$C_{10}H_7$ may improve dispersibility in the solvent, but have low dispersibility when formed into a film, with the result that the agglomeration of the particles is prone to occur. Using a silane coupling agent having a binding site having a heteroatom, such as amide linkage, in a substituent tends to provide good dispersibility when formed into a film.

Figure 3:
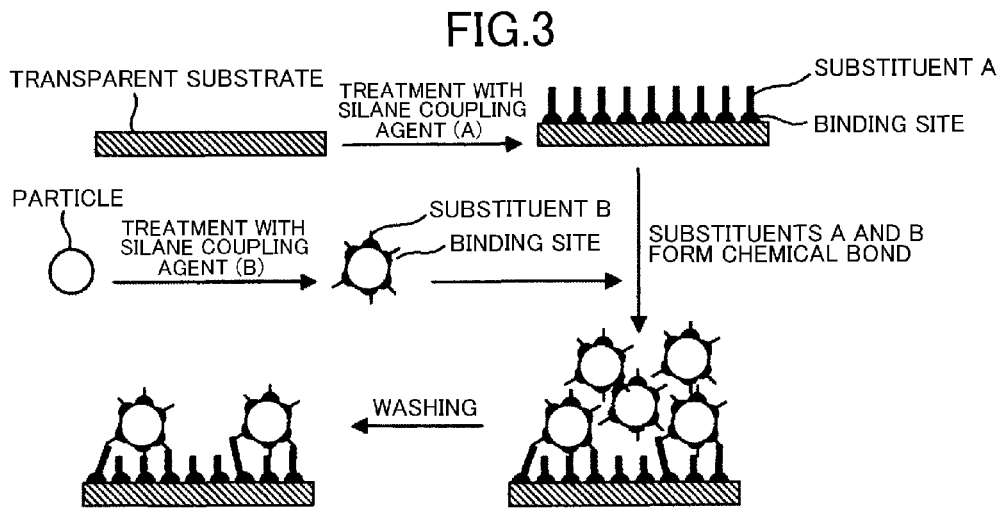
FIG. 3 An example of a particle surface modification process of a particle layer used in the light-emitting element according to the present invention.

A method of forming the particle layer in a case where the binder is not used is described. The particles of the particle layer having chemically modified surfaces are produced by chemically binding a transparent substrate having a chemically modified surface. FIG. 3 schematically illustrates the method.

The transparent substrate is treated with a silane coupling agent (A). This silane coupling agent has a substituent A. Further, the particles of the particle layer are treated with a silane coupling agent (B). This silane coupling agent has a substituent B. The substituents A and B are selected so as to form a chemical bond with each other. Next, the particles of the particle layer and the transparent substrate, which have been treated with the silane coupling agents, are reacted to form a chemical bond between the transparent substrate and the particles of the particle layer. Finally, washing is performed to remove particles of the particle layer that are not bonded to the transparent substrate. In this manner, the particle layer is formed on the transparent substrate. When an amino group is selected as the substituent A, a silane coupling agent having, for example, a glycidyl group as the substituent B is selected. The substituents may be exchanged so that the substituent A is a glycidyl group and the substituent B is an amino group. Further, a chlorine group may be selected instead of the glycidyl group. Substituents having a double bond, such as a vinyl group, may be selected for both the substituents A and B. The double bonds may be reacted to form a single bond and to bond the particles of the particle layer and the transparent substrate at the same time.

The particles constituting the particle layer need to have a refraction index that is higher than that of the transparent electrode. The transparent electrode, which is made of ITO or IZO, has the refraction index of approximately 2.1. It has been found from our study that the refraction index of the particles needs to be equal to or higher than the refraction index of the transparent electrode in order to cause leakage of light. Therefore, particles having a refraction index of 2.1 or higher are selected. Further, in a case of illumination, it is desired that the particles be white or a pale color in the visible range so as not to color the emitted light. Specifically, there are given titanium oxide (refraction index: 2.5 to 2.7), zirconium oxide (refraction index: 2.4), barium titanate (refraction index: 2.4), strontium titanate (refraction index: 2.37), bismuth oxide (refraction index: 2.45), and the like. This ensures that the tone of the light emitted from the light-emitting element in the case where the particle layer is formed to be substantially the same as the case where the particle layer is absent. Further, when a desired color of the emitted light is chromatic, particles having a color similar to the desired color may be used. For example, blue particles such as copper oxide (refraction index: 2.71) may be used when blue light is to be emitted, red particles such as ferric oxide (refraction index: 3.01) may be used when red light is to be emitted, and yellow particles such as cadmium oxide (refraction index: 2.49) may be used when yellow light is to be emitted.

The particles forming the particle layer act as a diffraction grating when arranged regularly, and the wavelength of the extracted light is determined by the particle size, with the result that the other wavelengths cannot be extracted. Therefore, the particles are arranged irregularly so that light in a wider wavelength range may be extracted. Further, when the particles overlap each other due to the agglomeration or the like, the extracted light is apt to scatter, with the result that the brightness at the front is reduced. Therefore, it is desired that one particle be formed at any given point on the transparent substrate so that the particles forming the particle layer do not overlap each other.

When the particles in the particle layer are in contact with each other, the extracted light reenters the adjacent particle in contact from the contact portion to lower the extraction efficiency. Therefore, it is desired that the particles be not in contact with each other. When the particles are prevented from being in contact with each other, the average thickness of the particle layer becomes less than the average particle size of the particles. In other words, in order to improve the light extraction efficiency, it is desired that the average thickness of the particle layer be set less than the average particle size of the particles.

It is preferred that the particles forming the particle layer be an inorganic oxide, which is resistant to denaturation. It is further preferred when the binder material is silica sol, which has high binding property with respect to an oxide.

As a result of study on the particle size, it has been found that the preferred average particle size is 80 to 200 nm when light in the visible range (of measured wavelengths of 360 to 760 nm) is to be extracted. In particular, the average particle size of 90 to 190 nm resulted in high extraction efficiency. In the case of particle size of smaller than 80 nm or larger than 200 nm, the light extraction efficiency for visible light was reduced. The reason is that the particle size probably relates to the wavelength of the extracted light because, as the particle size becomes smaller, the extraction efficiency for short wavelengths becomes higher and the extraction efficiency for long wavelengths becomes a little lower. The particles have a high specific density. For example, zirconium oxide has a specific density of 6.1, titanium oxide has a specific density of 4.1 to 4.2, and barium titanate has a specific density of 6.1. Therefore, the surfaces of the particles are chemically modified with the silane coupling agent to increase dispersibility in the solvent.

The adhesive layer, which is a resin layer having a low elasticity, may in some cases contain fine particles having a high refraction index in the resin and is provided between the transparent electrode and the particle layer. When the transparent substrate is flat, the particles of the particle layer and the adhesive layer should be brought into contact with each other without applying a pressure on the transparent substrate. However, in reality, the transparent substrate has undulation or the like and is not always flat. Therefore, if the adhesive layer does not deform at all, there arises a probability that some of the particles of the particle layer are not brought into contact with the adhesive layer. To address this problem, the storage elastic modulus of the adhesive layer is reduced so that, when a pressure is applied via the transparent substrate, the adhesive layer may be deformed to be brought into contact with the particles of the particle layer. Specifically, it is preferred that the storage elastic modulus be 100 kPa or less. This is because the storage elastic modulus of 100 kPa or less allows the particles of the particle layer and the transparent electrode to be brought into close contact with each other even if the glass has undulation of several μm. It should be noted, however, that the storage elastic modulus needs to be 1 kPa or more because, when the storage elastic modulus is too low, there is a fear that the transparent substrate may slide off the transparent electrode. Further, the lower limit of the indoor operating temperature under which the light emitting element is generally used is about 10° C. Therefore, setting the storage elastic modulus of the adhesive layer to 1 kPa to 100 kPa at 10° C. allows the particles of the particle layer and the transparent electrode to be brought into close contact with each other.

The extraction efficiency tends to be high when the adhesive layer has a high refraction index. Therefore, it is more preferred when particles of titanium oxide, zirconium oxide, barium titanate, or the like are added in a transparent resin. The refraction index is increased by 0.3 to 0.4 when the particles are contained in 10 to 30 wt % (refraction index: about 1.65 to 1.8) as compared to when no particle is contained (refraction index: about 1.45 to 1.55). Further, it is preferred that the size of the fine particles to be added be 5 to 50 nm in average particle size. When the size is larger than 50 nm, the adhesive layer becomes cloudy. When the size is smaller than 5 nm, on the other hand, the bulk density is reduced, with the result that the particles easily scatter and become hard to handle. It is preferred that the particles be an inorganic oxide. This is because inorganic oxides are chemically stable and do not change in tone even after being irradiated with the emitted light for a long period of time.

The method of producing the adhesive layer is to form a film of an adhesive resin for attachment, or to apply a monomer for forming the resin and then cure the monomer. The monomer of the adhesive layer may be made of the following materials. The adhesive layer is formed by adding a curing agent for facilitating the curing by light, heat, or the like to the materials, and then curing the materials.

Examples of the acrylic materials include methyl methacrylate, ethyl methacrylate, propyl methacrylate, isopropyl methacrylate, butyl methacrylate, isobutyl methacrylate, hexyl methacrylate, octylmethacrylate, 2-ethylhexylmethacrylate, decyl methacrylate, dodecyl methacrylate, methyl acrylate, ethyl acrylate, propyl acrylate, isopropyl acrylate, butyl acrylate, isobutyl acrylate, hexyl acrylate, octyl acrylate, 2-ethylhexyl acrylate, decyl acrylate, dodecyl acrylate, and the like. Other examples thereof include: ethylene glycol, propylene glycol, diethylene glycol, 1,3-dihydroxycyclobutane, 1,4-dihydroxycyclohexane, 1,5-dihydroxycyclooctane, and the like, each of which has a plurality of hydroxy groups in a molecule; ethylene glycol monoglycidyl ether, ethylene glycol diglycidyl ether, each of which has a glycidyl group in a terminal; a monomer having a cyclic portion such as a cycloalkane ring, an aromatic ring, or a norbornene ring at a side chain; a monomer having a bisphenol A-like skeleton; and the like.

Of the materials, an acrylic resin is used alone or in combination with a plurality of other types of resin to form the adhesive layer. The adhesive layer may be formed also by copolymerizing the materials with another polymer. The polymer to be used may include polyacrylic acid, polyvinyl alcohol, polyallyl amine, or the like. Alternatively, a polymer such as an acrylic resin, a urethane resin, or the like, which is already polymerized and has no reactive site for a monomer, may be dissolved in the monomer to be used, to thereby reduce shrinkage during the curing.

In order to reduce the storage elastic modulus, the material to be used is specifically a material having a glass transition temperature (Tg) that is equal to or lower than the room temperature. This is because a resin at a temperature that is equal to or lower than Tg is reduced in elasticity. An acrylic monomer has lower Tg as the number of carbon atoms in the side alkyl chain becomes larger. In order to set Tg to a temperature that is equal to or lower than the room temperature, it is particularly desired that the number of carbon atoms in the side chain of the acrylic monomer be about 4 or more so that enough flexibility and low elasticity may be given to the resin.

If the same monomer is used, it is more preferred when the resin has a lower average molecular weight because the elasticity is reduced. In order to reduce the average molecular weight, it is possible to increase the additive rate of a catalyst to be used in the curing. Further, in a case where light cure is used as the method of curing the monomer, the intensity of the irradiated light may be reduced to reduce the average molecular weight of the resin to be formed. In a case where heat cure is used, the average molecular weight of the resin to be formed may be reduced by using an initiating reagent that allows curing at as low a temperature as possible and performing the curing at as low a temperature as possible.

Another method may be to add a plasticizer. It is desired that the plasticizer to be added be dispersed uniformly in a frame so that the elasticity of the frame does not become non-uniform among different places. Therefore, it is preferred that the plasticizer be dissolved in a monomer. For example, in the case of using an acrylic monomer, a desired plasticizer is a phthalic acid ester having an ester bond in its structure, or an ester-based compound such as an adipic acid ester.

Specific examples of the phthalic acid ester include dimethyl phthalate, diethyl phthalate, dibutyl phthalate, di-2-ethylhexyl phthalate, di-n-octyl phthalate, diisononyl phthalate, dinonyl phthalate, diisodecyl phthalate, didecyl phthalate, and the like. Examples of the adipic acid ester include dibutyl adipate, dihexyl adipate, dioctyl adipate, di-2-ethylhexyl adipate, didecyl adipate, didodecyl adipate, and the like. Examples of the other plasticizer include a plasticizer having an ester portion such as dioctyl azelate, dibutyl sebacate, dioctyl sebacate, tricresyl phosphate, acetyl tributyl citrate, or trioctyl trimellitate.

Figure 4:
FIG. 4 A sectional structure of an adhesive layer of the light-emitting element according to the present invention.
Figure 5:
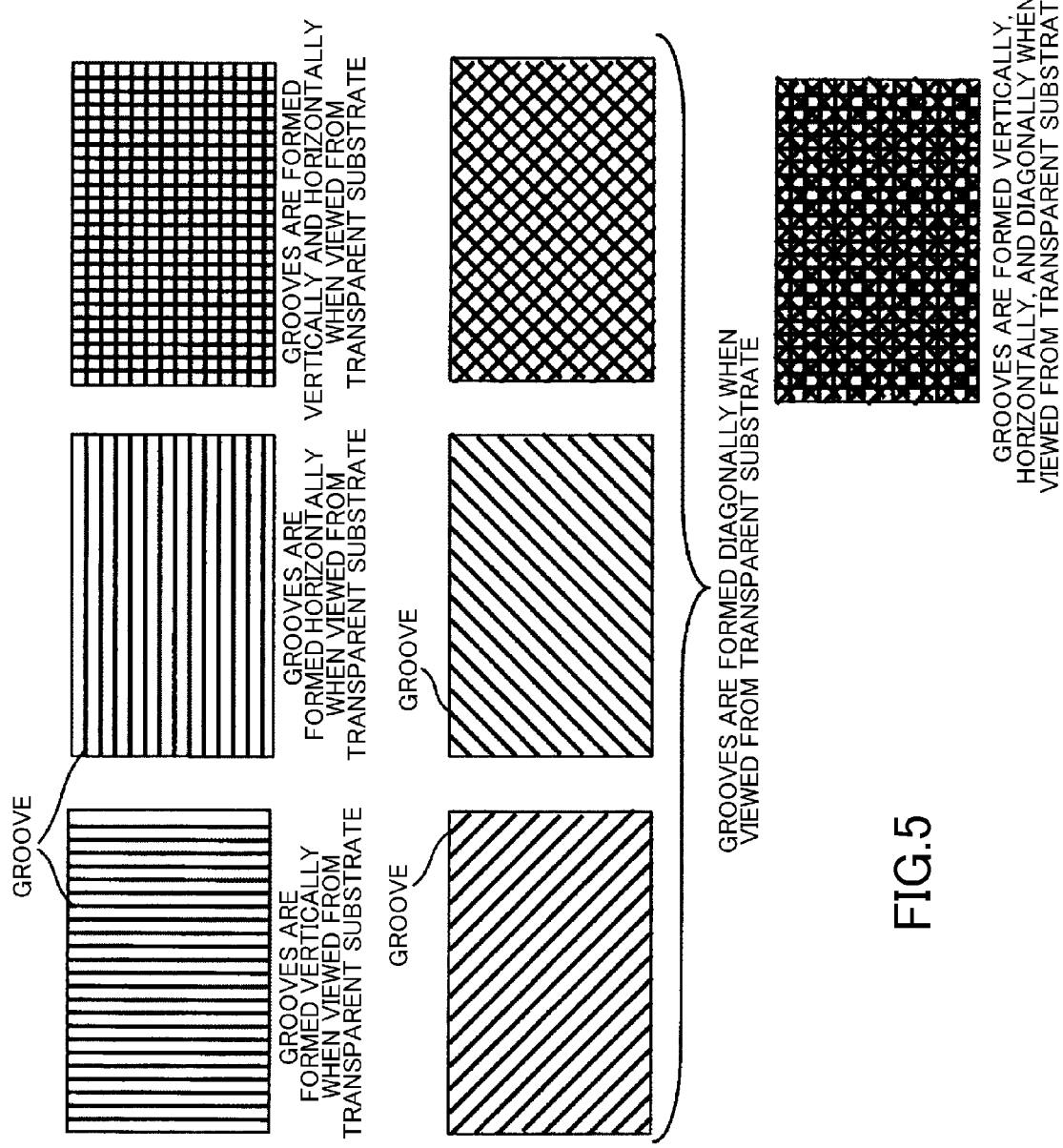
FIG. 5 Examples of structure of grooves of the adhesive layer of the light-emitting element according to the present invention.

Forming grooves on the surface of the adhesive layer improves the adherence between the particles of the particle layer and the adhesive layer. FIG. 4 is a sectional view of the adhesive layer in this case. FIG. 5 illustrates forms of the grooves.

Figure 6:
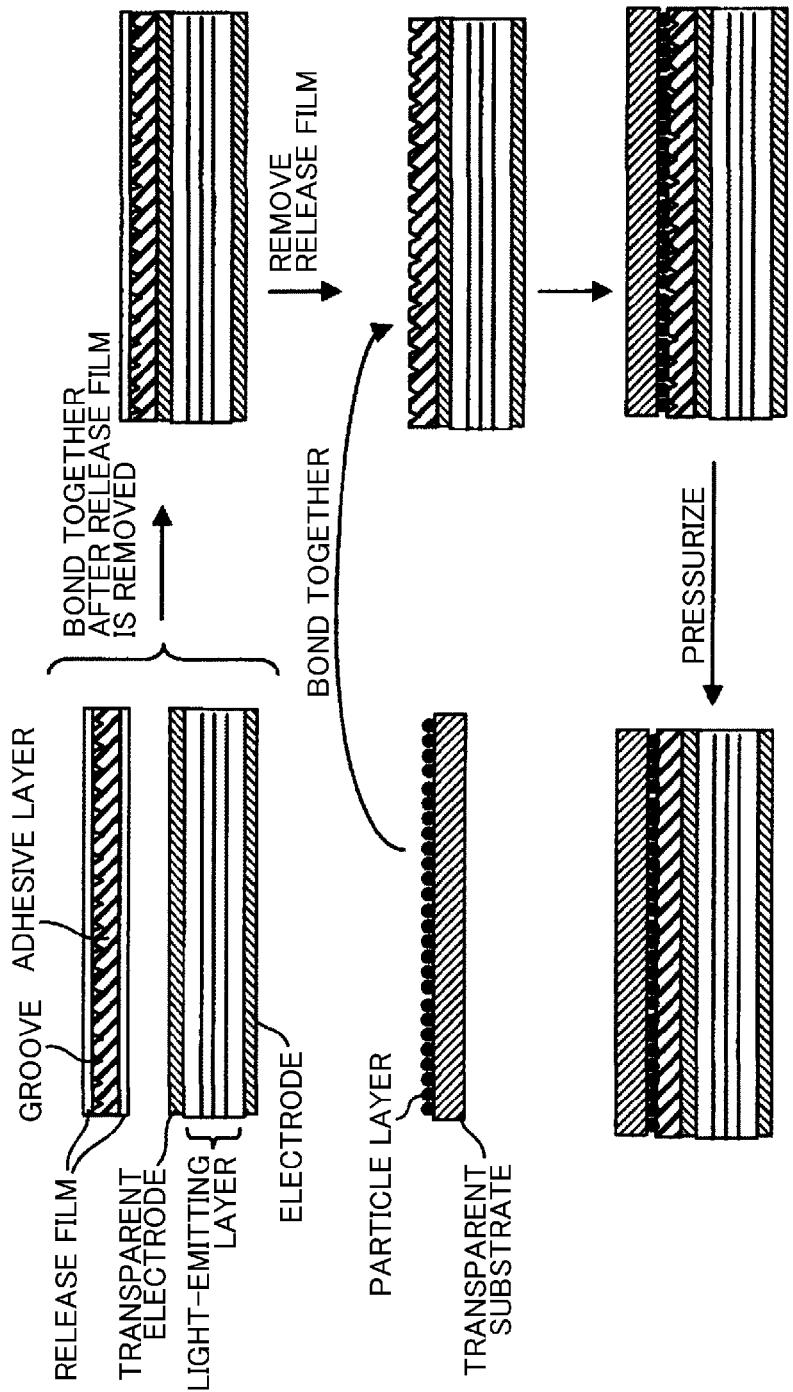
FIG. 6 A production process of the light-emitting element according to the present invention.

FIG. 6 illustrates a process in a case where the adhesive layer is first provided on the transparent electrode side. Release films are attached in advance on both surfaces of the adhesive layer having the grooves. One of the release films is removed to attach the surface without the grooves on the transparent electrode. The film is flexible so that the film may be bent a little to attach the adhesive layer on the transparent electrode without causing bubbles. Next, the transparent substrate having the particle layer formed thereon is brought into contact with the adhesive layer (on the side having the grooves). Although the transparent substrate, the transparent electrode, and the light-emitting layer cannot be bent, air is pushed out of the grooves by pressurizing the transparent substrate, and hence the particles of the particle layer and the adhesive layer are brought into close contact with each other. Note that, during the pressurization, an autoclave or the like is used so that the pressure is applied to the entire element, to thereby suppress the damage to the element to such a low level as to be negligible.

Figure 7:
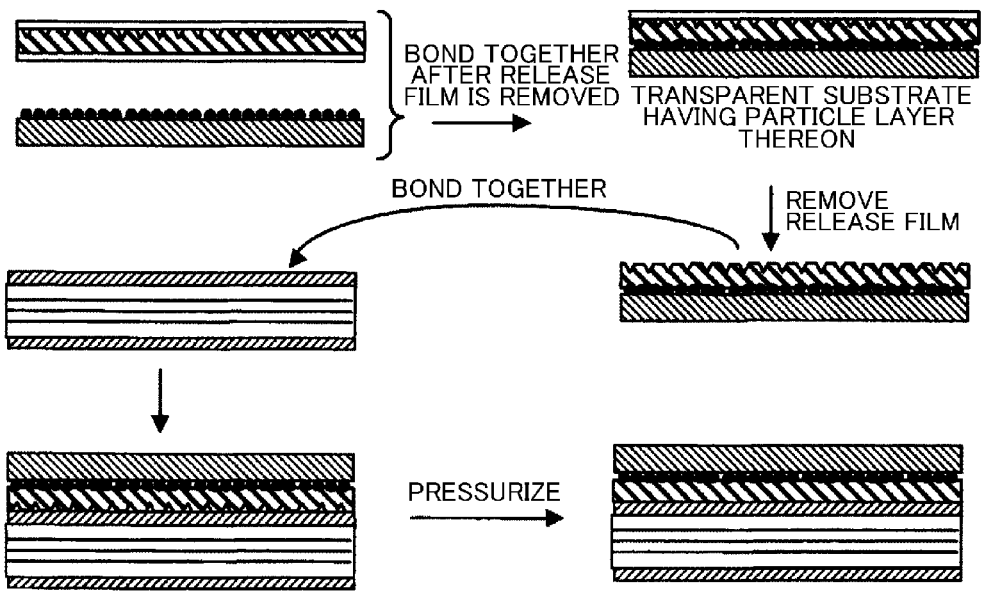
FIG. 7 Another production process of the light-emitting element according to the present invention.

FIG. 7 illustrates a process in a case where the adhesive layer is first provided on the particle layer side. One of the release films is removed to attach the surface without the grooves on the transparent electrode. The film is flexible so that the film may be bent a little to attach the adhesive layer on the transparent substrate without causing bubbles. Next, the transparent electrode is brought into contact with the adhesive layer (on the side having the grooves). Air is pushed out of the grooves by pressurizing the transparent substrate, and hence the transparent electrode and the adhesive layer are brought into close contact with each other without causing bubbles. Note that, during the pressurization, an autoclave or the like is used so that the pressure is applied to the entire element and hence the adherence between the transparent electrode and the adhesive layer is improved, to thereby suppress the damage to the element to such a low level as to be negligible.

Figure 8:
FIG. 8 A schematic sectional view of the light-emitting element according to the present invention.

Referring to FIG. 8, a first embodiment is described.

In the light-emitting element according to the present invention, the particle layer is provided on the transparent electrode via the adhesive layer. The particles of the particle layer are formed on the transparent substrate. The light-emitting element is formed by the process of FIG. 6 or 7. The formed element is contained in a casing. The light-emitting layer may be reduced in light-emitting efficiency under the influence of moisture and oxygen. Therefore, sealing layers are provided at the ends thereof.

Figure 9:
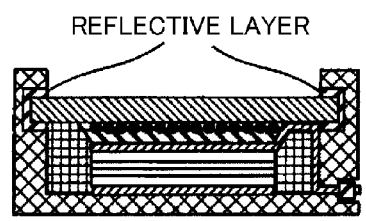
FIG. 9 A schematic sectional view of the light-emitting element according to the present invention.

Referring to FIG. 9, a second embodiment is described.

As illustrated in FIG. 9, this embodiment has a feature that reflective layers are provided at ends of the transparent substrate. Light extracted efficiently by the particle layer enters the transparent substrate, and then a part of the light exits from the ends of the transparent substrate. The light irradiates the casing and is attenuated. The light is reflected by the reflective layers back into the transparent substrate. Therefore, a part of the light is extracted by the particle layer to be reflected by the electrode under the light-emitting layer, and is eventually emitted to the outside from the transparent substrate, with the result that the improvement in light-emitting efficiency may be attained.

Figure 10:
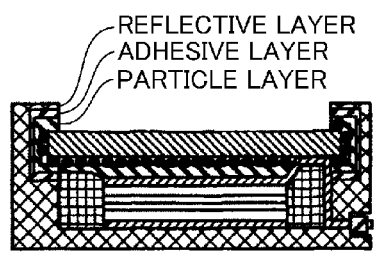
FIG. 10 A schematic sectional view of the light-emitting element according to the present invention.

Referring to FIG. 10, a third embodiment is described.

Of the light traveling toward the ends of the transparent substrate, only a part of the light exits from the ends, and the remaining part is reflected on the inner surfaces of the ends and does not exit from the ends. Therefore, the particle layer and the adhesive layer are provided also at the ends of the transparent substrate so that the light leaks from the ends of the transparent substrate. The light travels through the adhesive layer to strike the reflective layer, and as in the second embodiment, is eventually emitted to the outside from the transparent substrate, with the result that the improvement in light-emitting efficiency may be attained.

Referring to FIG. 7, a fourth embodiment is described.

In FIG. 7, the transparent substrate in a state in which the adhesive layer is attached after forming the particle layer is illustrated as the "transparent substrate with a film". This substrate is movable as a part unless the release film is removed. The step of laminating the light-emitting layer, the electrode, the transparent electrode, and the like needs to be performed in a highly clean room. On the other hand, in the case of forming the particle layer, where particles having the average particle size of 80 to 200 nm are handled, the cleanness is reduced by the scattering of the used particles when the transparent substrate having the particle layer formed thereon is produced in a highly clean room, which possibly leads to negative effects such as reduced production yields of other parts and products. Therefore, when the "transparent substrate with a film" of FIG. 7, on which the process up to the adhesion of the adhesive layer is completed, is produced in advance as a part in a separate room or by a different manufacturer, not only a merit that a high light extraction efficiency may be attained for the transparent substrate to be used in the light-emitting element, but also a merit that the cleanness may be maintained in the step of laminating the light-emitting layer, the electrode, the transparent electrode, and the like is obtained.

Figure 11:
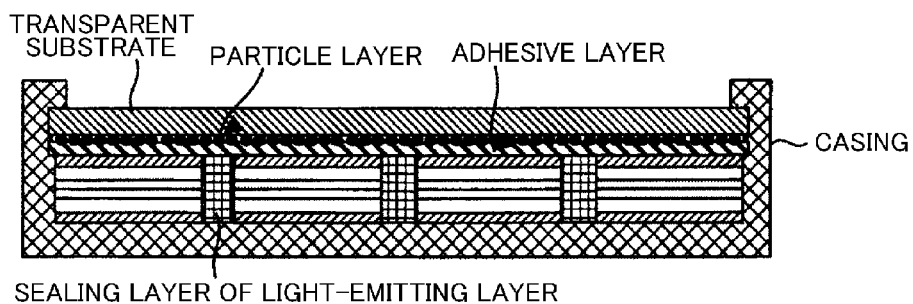
FIG. 11 A schematic sectional view of the light-emitting element according to the present invention.
Figure 12:
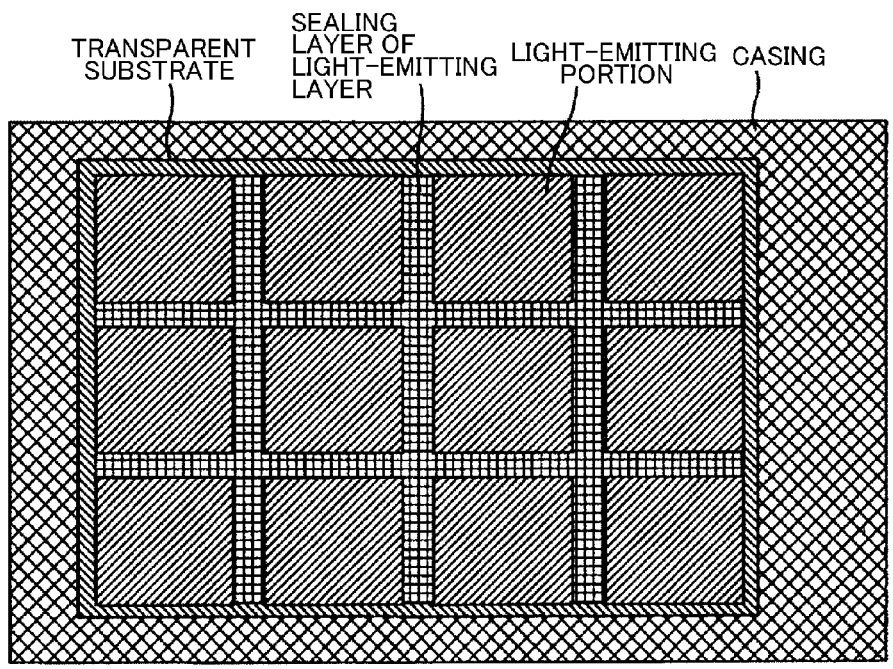
FIG. 12 The light-emitting element according to the present invention.

Referring to FIGS. 11 and 12, a fifth embodiment is described.

When a "transparent substrate with a film" capable of covering a plurality of the light-emitting elements is used, a light-emitting element having a plurality of light-emitting portions for one transparent substrate may be formed. For a number of the light-emitting portions, operations of forming a particle layer on the transparent substrate and further forming an adhesive layer thereon may be performed at once. As described above, when the transparent layer, the particle layer, or the adhesive layer is provided in common to the light-emitting portions, it is possible to reduce the time required for the production.

Figure 13:
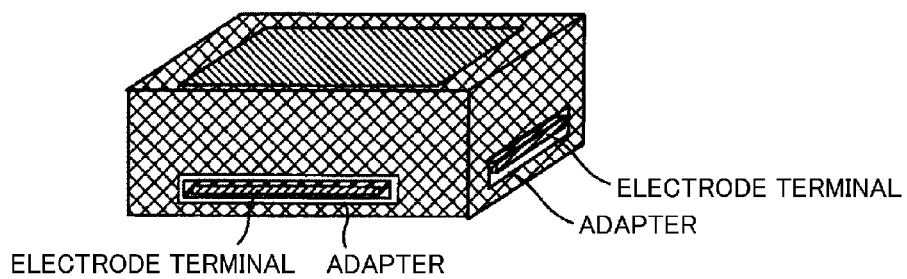
FIG. 13 The light-emitting element according to the present invention.
Figure 14:
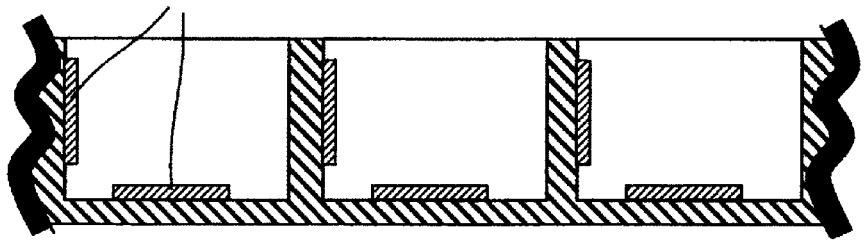
FIG. 14 A casing of a light-emitting device according to the present invention, in which a plurality of light-emitting elements are connected.

Referring to FIGS. 13 and 14, a sixth embodiment is described.

In attaching light-emitting elements to the casing of a light-emitting device, when adapters including electrode terminals are used, attachment and detachment to and from the light-emitting device may be facilitated. Further, by providing adapters to two sides of the four sides, it is possible to reduce the load on the adapters during the time when the light-emitting elements are fixed to the casing of the light-emitting device. If the light emitting elements are fixed only at one side, when the light-emitting device is carried around, for example, a force is applied only on the one side to which an adapter is provided so that there is a high chance of damaging the adapter. Therefore, a plurality of adapters are provided in a plane in which the light-emitting elements and the light-emitting device are brought into contact with each other. In FIG. 14, the adapters are provided to two sides so that the force is applied across the plane of each light-emitting element and hence the force applied per unit area becomes smaller, with the result that damage is less likely to occur even when the light-emitting device is repeatedly carried around. Note that, in FIG. 13, the adapters are provided to two adjacent sides, but may be alternatively provided to opposite sides.

Figure 15:
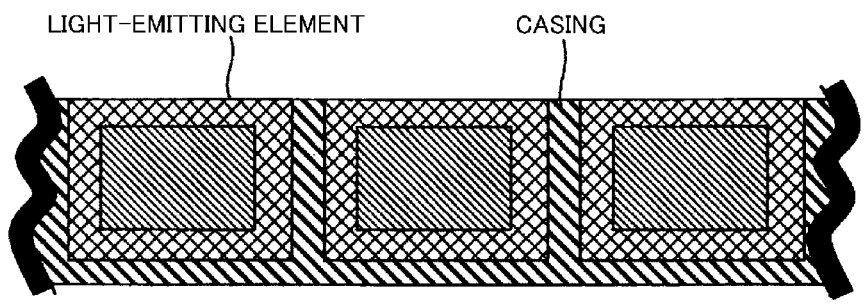
FIG. 15 The light-emitting device according to the present invention.
Figure 16:
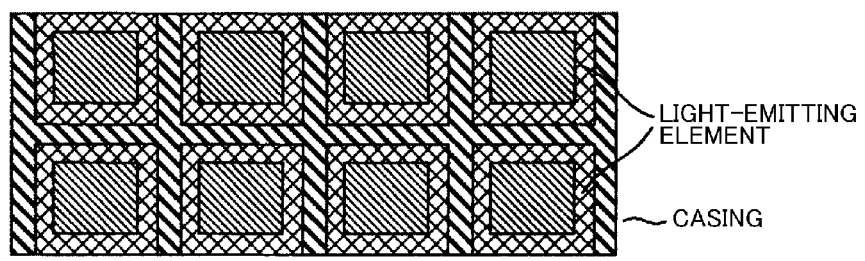
FIG. 16 The light-emitting device according to the present invention.

Referring to FIGS. 14, 15, and 16, a seventh embodiment is described.

When a plurality of light-emitting elements may be attached as in the casing of FIG. 14, it is possible to form a light-emitting device in which the plurality of light-emitting elements are attached as illustrated in FIG. 15. In FIG. 16, the light-emitting elements are arranged in two rows. By providing the plurality of light-emitting elements, even if the performance of one light-emitting element is reduced, a drop in the light-emitting amount is small as long as other light-emitting elements are normal. In addition, the light-emitting element is easy to detach, and hence a normal light-emitting amount may be immediately recovered by exchanging the light-emitting element with the reduced performance with a normal one. Further, it is more preferred when wirings for the light-emitting elements are provided in parallel so that, even if the light-emitting element with the reduced performance is removed, the current to the other light-emitting elements is not blocked.

Figure 17:
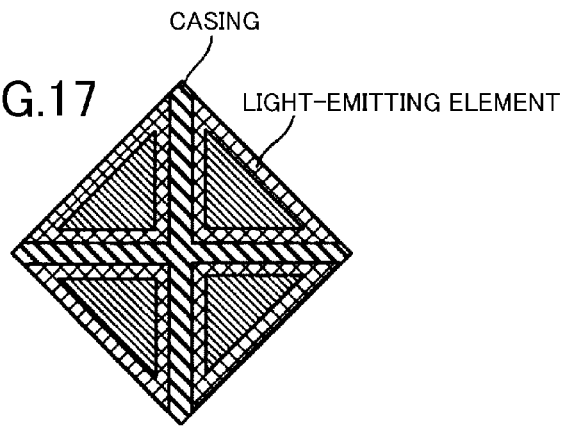
FIG. 17 The light-emitting device according to the present invention.
Figure 18:
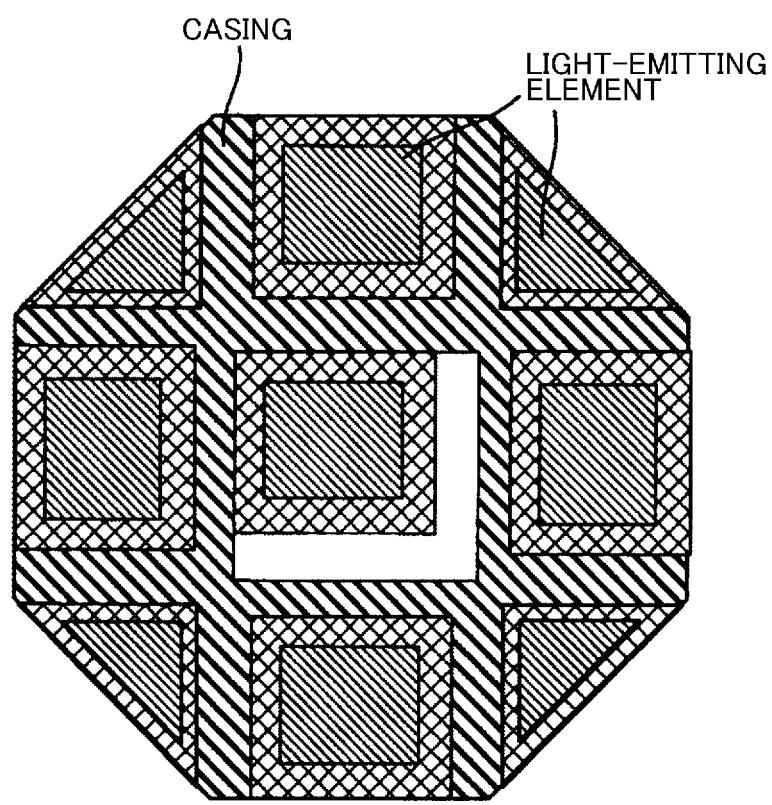
FIG. 18 The light-emitting device according to the present invention.

Referring to FIGS. 17 and 18, an eighth embodiment is described.

No problem occurs even if the light-emitting elements have a triangular shape. When adapters are provided to two sides of the light-emitting device as in the case of the light emitting elements having a rectangular shape of FIG. 13, only one side is left with no adapter. Therefore, the bonding property to the casing is improved and the force applied to the adapters becomes smaller as compared to the light-emitting elements having the rectangular shape, and as a result, impact resistance is improved over the light-emitting elements having the rectangular shape. Further, when the light-emitting elements having triangular and rectangular shapes are combined appropriately, it is possible to form the light-emitting device having an octagonal shape as in FIG. 18. In this manner, an illumination device having a novel shape, which has hitherto been impossible to form, may be proposed to improve the design.

The invention claimed is:
1. A light-emitting element, comprising:
   a light-emitting layer provided between a transparent electrode and an electrode;
   a transparent substrate provided on a side of the transparent electrode that is opposite to a side on which the electrode is provided;

a particle layer provided between the transparent electrode and the transparent substrate; and an adhesive layer provided between the transparent electrode and the particle layer, wherein the particle layer includes particles having a refraction index that is higher than a refraction index of the transparent electrode, wherein the particles constituting the particle layer are configured to cause light from the light-emitting layer to scatter and wherein the particle layer has an average thickness that is less than an average particle size of the particles to improve extraction of light from the light-emitting layer.

2. The light-emitting element according to claim 1, wherein the particles constituting the particle layer have an average particle size of 80 to 200 nm.

3. The light-emitting element according to claim 1, wherein the particles constituting the particle layer are formed of titanium oxide, zirconium oxide, barium titanate, strontium titanate, or bismuth oxide.

4. The light-emitting element according to claim 1, wherein the adhesive layer is added with particles of an inorganic oxide.

5. The light-emitting element according to claim 1, wherein the adhesive layer has a storage elastic modulus of 1 kPa or more and 100 kPa or less.

6. A light-emitting device comprising:
the light-emitting element according to claim 1;
a casing; and
a reflective layer provided between ends of the transparent substrate and the casing.

7. The light-emitting device according to claim 6, wherein the particle layer and the adhesive layer are further provided between the reflective layer and the ends of the transparent substrate.

8. A light-emitting device comprising:
a plurality of the light-emitting elements according to claim 1,
wherein the transparent substrate, the particle layer, or the adhesive layer is provided in common to the plurality of the light-emitting elements.

9. A light-emitting device comprising:
a plurality of the light-emitting elements according to claim 1; and
a plurality of adapters provided in a plane in which the plurality of the light-emitting elements and the light-emitting device are brought into contact with each other.

10. The light-emitting device according to claim 9, further comprising wirings provided in parallel for the plurality of the light-emitting elements respectively for supplying power to the plurality of the light-emitting elements.

11. The light-emitting device according to claim 6, wherein the light-emitting element has a light-emitting surface of a triangular shape.

12. The light-emitting device according to claim 6, wherein the light-emitting element has a light-emitting surface of a triangular shape and a rectangular shape in combination.

13. The light-emitting element according to claim 1, wherein an average of the distance between particles which are next to each other is larger than an average particle diameter of the particles.

14. The light-emitting element according to claim 1, wherein the particle layer is configured so that the particles are prevented from being in contact with one another.

15. A structure configured to be attached to a light-emitting layer comprising:
a transparent substrate;
a transparent electrode;
a particle layer and an adhesive layer provided between the transparent substrate and the transparent electrode; and
a release film provided on a side of the adhesive layer that is opposite to a side on which the particle layer is provided,
wherein the particle layer includes particles having a refraction index that is higher than a refraction index of the transparent electrode,
wherein the adhesive layer has grooves formed in a surface on a side on which the release film is provided,
wherein the particles constituting the particle layer are configured to cause light from the light-emitting layer to scatter and wherein the particle layer has an average thickness that is less than an average particle size of the particles to improve extraction of light from the light-emitting layer.

16. The light-emitting element according to claim 15, wherein the particle layer is configured so that the particles are prevented from being in contact with one another.

17. A light-emitting element, comprising:
a light-emitting layer provided between a transparent electrode and an electrode;
a transparent substrate provided on a side of the transparent electrode that is opposite to a side on which the electrode is provided;
a particle layer provided between the transparent electrode and the transparent substrate; and
an adhesive layer provided between the transparent electrode and the particle layer,
wherein the particle layer includes particles having a refraction index that is higher than a refraction index of the transparent electrode,
means for improving extraction of light from the light-emitting layer by configuring the particles constituting the particle layer to cause light from the light-emitting layer to scatter and to have an average particle size be larger than an average thickness of the particle payer.

18. The light-emitting element according to claim 17, wherein the particle layer is configured so that the particles are prevented from being in contact with one another.

* * * * *